(12) United States Patent
Seki et al.

(10) Patent No.: US 10,964,898 B2
(45) Date of Patent: Mar. 30, 2021

(54) PROTECTION SHEET, DISPLAY, AND ELECTRONIC APPARATUS

(71) Applicant: JOLED INC., Tokyo (JP)

(72) Inventors: Takahiro Seki, Tokyo (JP); Katsumasa Yamazaki, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/524,714

(22) Filed: Jul. 29, 2019

(65) Prior Publication Data

US 2020/0044170 A1 Feb. 6, 2020

(30) Foreign Application Priority Data

Jul. 31, 2018 (JP) ................ JP2018-144379

(51) Int. Cl.
*H01L 29/08* (2006.01)
*H01L 35/24* (2006.01)
(Continued)

(52) U.S. Cl.
CPC .......... *H01L 51/0097* (2013.01); *B32B 27/08* (2013.01); *G02F 1/133308* (2013.01); *G09F 9/301* (2013.01); *H01L 51/5237* (2013.01); *B32B 2307/546* (2013.01); *B32B 2457/202* (2013.01); *B32B 2457/206* (2013.01);
(Continued)

(58) Field of Classification Search
CPC .... G09G 2380/02; G09G 2330/04–045; H01L 51/0097; H01L 51/5237; B32B 27/08; B32B 2307/546; B32B 2457/202; B32B 2457/206; G02F 1/133308; G02F 2001/133331; G02F 2201/503
See application file for complete search history.

(56) References Cited

U.S. PATENT DOCUMENTS 6,815,070 B1 11/2004 Bürkle et al.
2006/0152648 A1* 7/2006 Kim ................ G02F 1/133308
349/58
(Continued)

FOREIGN PATENT DOCUMENTS

JP 2002-542971 12/2002
JP 2007084655 A * 4/2007
(Continued)

*Primary Examiner* — Calvin Y Choi
(74) *Attorney, Agent, or Firm* — Greenblum & Bernstein, P.L.C.

(57) ABSTRACT

A display includes a display panel and a first protection sheet. The display panel has flexibility and a light output face. The first protection sheet is provided on the light output face and includes a first shock dispersion layer, a first strain relaxation layer, and a first shock absorption layer. The first shock dispersion layer includes a flexible reinforced-glass member, a flexible hard-coat film, or a flexible double-sided hard-coat film. The first strain relaxation layer includes a wet-laminated layer or a dry-laminated layer that is in close contact with a surface of the first shock dispersion layer adjacent to the display panel. The first shock absorption layer includes a gel layer having a thickness of submillimeter order or greater. The first shock absorption layer, the first strain relaxation layer, and the first shock dispersion layer are laminated in this order from the light output face of the display panel.

12 Claims, 8 Drawing Sheets

(51) Int. Cl.
*H01L 51/00* (2006.01)
*H01L 51/52* (2006.01)
*G02F 1/1333* (2006.01)
*B32B 27/08* (2006.01)
*G09F 9/30* (2006.01)

(52) U.S. Cl.
CPC ............ *G02F 2001/133331* (2013.01); *G02F 2201/503* (2013.01)

(56) References Cited

U.S. PATENT DOCUMENTS

2017/0263889 A1    9/2017   Seki et al.
2017/0293194 A1* 10/2017   Hou .................. G02F 1/167
2018/0197933 A1*   7/2018   Son .................. H01L 51/5253

FOREIGN PATENT DOCUMENTS

| | | | |
|---|---|---|---|
| JP | 2009037119 A | * | 2/2009 |
| JP | 2014-228615 | | 12/2014 |
| JP | 2016-184180 | | 10/2016 |
| JP | 2017-024386 | | 2/2017 |
| JP | 2017-161621 | | 9/2017 |

\* cited by examiner

PROTECTION SHEET, DISPLAY, AND ELECTRONIC APPARATUS

CROSS REFERENCE TO RELATED APPLICATIONS

This application claims the benefit of Japanese Priority Patent Application No. 2018-144379 filed on Jul. 31, 2018, the entire contents of which are incorporated herein by reference.

BACKGROUND

The disclosure relates to a protection sheet, a display, and an electronic apparatus.

An external impact force exerted on a display can damage a surface or an internal portion of the display, which could result in malfunctions of the display. Flexible displays, in particular, are disadvantageous in their low shock resistance in spite of their advantages of thinness, light-weight, and flexibility. To improve the shock resistance, a typical display includes a reinforced glass sheet attached to a surface of the display. Reference is made to Japanese Unexamined Patent Application Publication Nos. 2016-184180, 2017-024386, and 2014-228615, for example.

SUMMARY

Unfortunately, a flexible display with a reinforced glass sheet inevitably increases in weight and thickness. A possible measure against this concern is to etch the reinforced glass sheet into a thin thickness. However, the reinforced glass sheet etched into a thin thickness suffers from a significant decrease in shock resistance and is readily broken just by a small external force. These issues could be common to a display having a surface covered with a member with characteristics similar to the reinforced glass sheet.

It is desirable to provide a protection sheet having high shock resistance and flexibility, to a display including such a protection sheet, and to an electronic apparatus including such a display.

A display according to one embodiment of the disclosure includes a display panel and a first protection sheet. The display panel has flexibility and a light output face. The first protection sheet is provided on the light output face and includes a first shock dispersion layer, a first strain relaxation layer, and a first shock absorption layer. The first shock dispersion layer includes a flexible reinforced-glass member, a flexible hard-coat film, or a flexible double-sided hard-coat film. The first strain relaxation layer includes a wet-laminated layer or a dry-laminated layer that is in close contact with a surface of the first shock dispersion layer adjacent to the display panel. The first shock absorption layer includes a gel layer having a thickness of submillimeter order or greater. The first shock absorption layer, the first strain relaxation layer, and the first shock dispersion layer are laminated in this order from the light output face of the display panel.

An electronic apparatus according to one embodiment of the disclosure includes a display including a display panel and a protection sheet. The display panel has a light output face. The protection sheet is provided on the light output face and includes a shock dispersion layer, a strain relaxation layer, and a shock absorption layer. The shock dispersion layer includes a flexible reinforced-glass member, a flexible hard-coat film, or a flexible double-sided hard-coat film. The strain relaxation layer includes a wet-laminated layer or a dry-laminated layer that is in close contact with a surface of the shock dispersion layer adjacent to the display panel. The shock absorption layer includes a gel layer having a thickness of submillimeter order or greater. The shock absorption layer, the strain relaxation layer, and the shock dispersion layer are laminated in this order from the light output face of the display panel.

A protection sheet according to one embodiment of the disclosure is configured to protect a light output face of a display panel. The protection sheet includes a shock dispersion layer, a strain relaxation layer, and a shock absorption layer. The shock dispersion layer includes a flexible reinforced-glass member, a flexible hard-coat film, or a flexible double-sided hard-coat film. The strain relaxation layer includes a wet-laminated layer or a dry-laminated layer that is in close contact with a surface of the shock dispersion layer adjacent to the display panel. The shock absorption layer includes a gel layer having a thickness of submillimeter order or greater. The shock absorption layer, the strain relaxation layer, and the shock dispersion layer are laminated in this order from the light output face.

DETAILED DESCRIPTION

Some example embodiments of the technology will now be described in detail with reference to the attached drawings. Note that the description is given in the following order.
1. Embodiments (Displays)
2. Modification Examples (Displays)
3. Application Examples (Electronic Apparatuses)

1. Embodiments

[Configuration]

Figure 1:
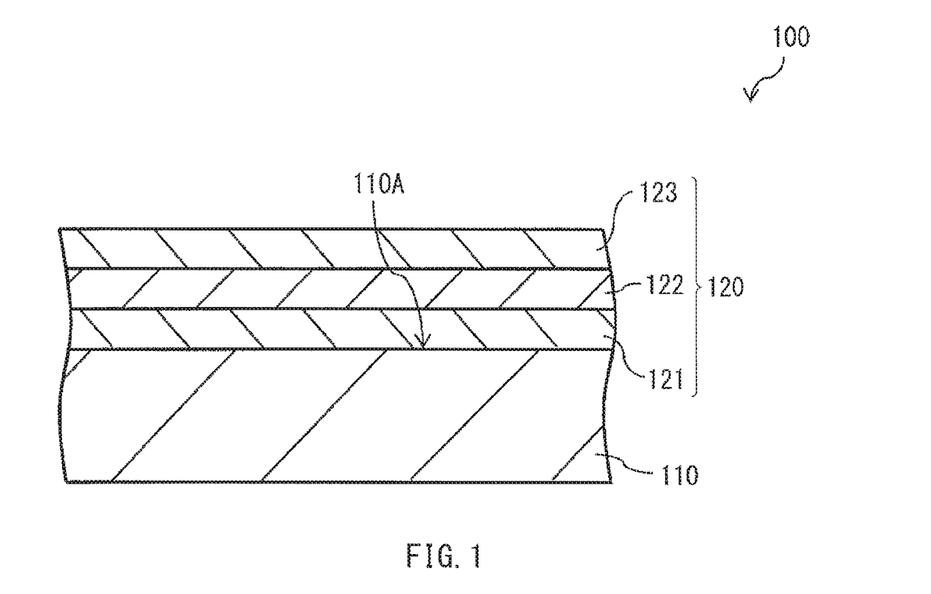
FIG. 1 is a cross-sectional view of a display having an example configuration according to one example embodiment of the disclosure.
Figure 2:
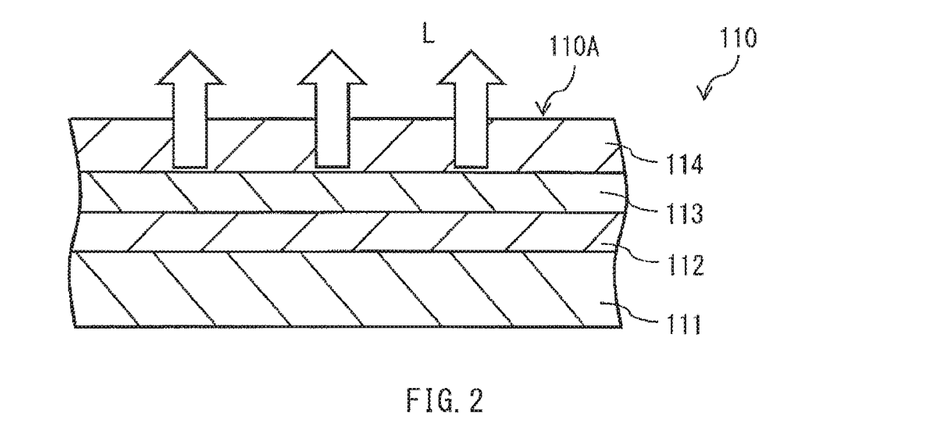
FIG. 2 is a cross-sectional view of a display panel illustrated in FIG. 1 having an example configuration according to one example embodiment of the disclosure.

FIG. 1 illustrates an example cross-sectional configuration of a display 100 according to an example embodiment of the disclosure. The display 100 includes a display panel 110 having a light output face 110A, and a protection sheet 120 provided on the light output face 110A of the display panel 110. FIG. 2 illustrates an example cross-sectional configuration of the display panel 110. The display panel 110 may include multiple display pixels arranged in two-dimensional matrix below the light output face 10A. Image light L may be formed by light beams outputted from the multiple display pixels. A driver that drives the display pixels may be mounted on an outer edge portion of the display panel 110. The display 100 may include a controller that controls the display panel 110, and controls the display panel 110 on the basis of control signals from the controller.

[Display Panel 110]

The display panel 110 may generate the image light L on the basis of the control signals from the controller, and output the generated image light L to the outside through the light output face 110A. The display panel 110 may be, for example, an organic electroluminescent (EL) panel or a liquid crystal panel. Alternatively, the display panel 110 may be a display panel of other type than the organic EL panel and the liquid crystal panel.

The display panel 110 illustrated in FIG. 2 may be a top-emission organic EL panel. As illustrated in FIG. 2, for example, the display panel 110 may include a device formation substrate 111, a thin-film transistor (TFT) layer 112, an organic layer 113, and a sealing substrate 114. The device formation substrate 111, the TFT layer 112, the organic layer 113, and the sealing substrate 114 may be disposed in this order toward the light output face 110A. For example, a surface of the sealing substrate 114 may correspond to the light output face 110A. The device formation substrate 111 is provided for formation of the TFT layer 112 and the organic layer 113. The device formation substrate 111 may be, for example, a glass substrate or a plastic substrate.

Specific but non-limiting examples of the glass substrate may include a substrate that includes high strain point glass, soda-lime glass ($Na_2O \cdot CaO \cdot SiO_2$), borosilicate glass ($Na_2O \cdot B_2O_3 \cdot SiO_2$), forsterite ($2MgO \cdot SiO_2$), or lead glass ($Na_2O \, PbO \cdot SiO_2$). Specific but non-limiting examples of the plastic substrate may include a substrate that includes an organic polymer, such as polymethyl methacrylate (PMMA), polyvinyl alcohol (PVA), polyvinyl phenol (PVP), polyethersulfone (PES), polyimide (PI), polycarbonate (PC), polyethylene terephthalate (PET), or triacetylcellulose (TAC). The plastic substrate may be a film substrate or a sheet-like substrate that has flexibility.

The organic layer 113 may include multiple display pixels each including an organic electroluminescent element, for example. The image light L may be formed by light beams emitted from the organic electroluminescent elements. The TFT layer 112 may include multiple display pixels each including a pixel circuit. The pixel circuits may control electric currents flowing in the organic electroluminescent elements in the respective display pixels. The sealing substrate 114 may seal the organic electroluminescent elements in the organic layer 113. Optionally, the sealing substrate 14 may include a color filter or a black matrix. The sealing substrate 114 may include a substrate that includes a material the same as that of the device formation substrate 111. Alternatively, the sealing substrate 114 may include a polarization plate. Still alternatively, the sealing substrate 114 may include a laminate of a low retardation film and a polarization plate. Optionally, the sealing substrate 114 may be omitted in the display panel 110.

Figure 3:
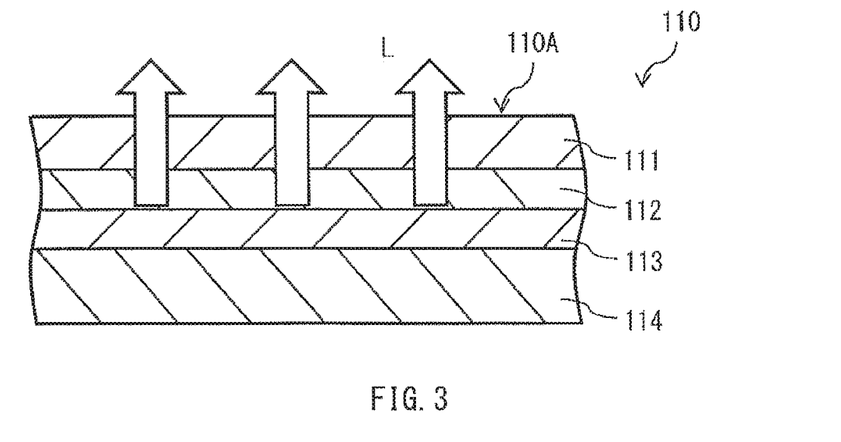
FIG. 3 is a cross-sectional view of the display panel illustrated in FIG. 1 having another example configuration according to one example embodiment of the disclosure.

FIG. 3 illustrate another example cross-sectional configuration of the display panel 110. The display panel illustrated in FIG. 3 may be a bottom-emission organic EL panel. As illustrated in FIG. 3, for example, the display panel 110 may include the device formation substrate 111, the TFT layer 112, the organic layer 113, and the sealing substrate 114. The device formation substrate 111, the TFT layer 112, the organic layer 113, and the sealing substrate 114 may be disposed in this order from the light output face 110A. For example, a surface of the device formation substrate 111 may correspond to the light output face 110A.

The device formation substrate 111 and the sealing substrate 114 of the display panel 110 illustrated in FIG. 2 or 3 may each be a flexible plastic substrate. In such a case, the display panel 110 may be a flexible organic EL panel.

Figure 4:
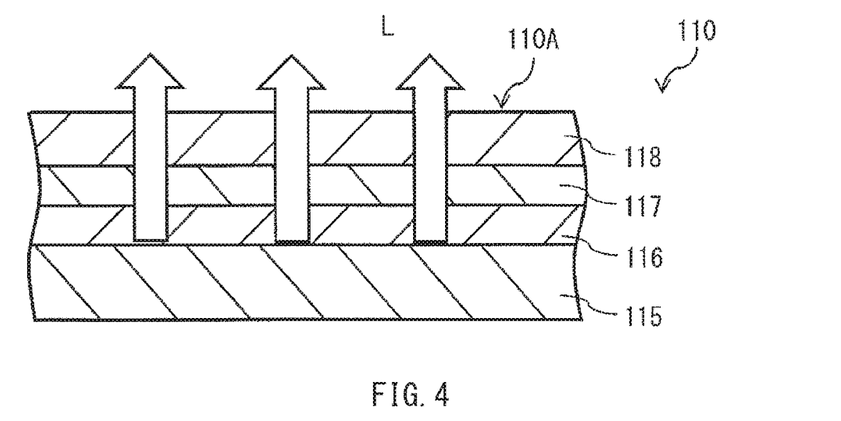
FIG. 4 is a cross-sectional view of the display panel illustrated in FIG. 1 having another example configuration according to one example embodiment of the disclosure.

FIG. 4 illustrates an example cross-sectional configuration of the display panel 110. The display panel 110 illustrated in FIG. 4 may be a liquid crystal panel. As illustrated in FIG. 4, for example, the display panel 110 may include a backlight 115, a polarization plate 116, a liquid crystal layer 117, and a polarization plate 118. The backlight 115, the polarization plate 116, the liquid crystal layer 117, and the polarization plate 118 may be disposed in this order toward the light output face 110A. For example, a surface of the polarization plate 118 may correspond to the light output face 110A. The backlight 115 may supply light through the polarization plate 116 to an optical modulator that includes the polarization plate 116, the liquid crystal layer 117, and the polarization plate 118. The axis of transmission of the polarization plate 116 and the axis of transmission of the polarization plate 118 may be set in accordance with, for example, a driving mode of the liquid crystal layer 117 to have a crossed Nichol relationship with each other, for example. The liquid crystal layer 117 may control the transmittance of light passing through the liquid crystal layer 117 on the basis of a voltage applied thereto. The liquid crystal layer 117 may include liquid crystals that are driven to perform displaying in a vertical alignment (VA) mode, a twisted nematic (TN) mode, an electrically controlled birefringence (ECB) mode, a fringe field switching (FFS) mode, or an in-plane switching (IPS) mode, for example.

[Protection Sheet 120]

The protection sheet 120 protects the light output face 110A of the display panel 110. The protection sheet 120 may be a flexible sheet having light-transmissivity to the image light L. As illustrated in FIG. 1, for example, the protection sheet 120 includes a shock absorption layer 121, a strain relaxation layer 122, and a shock dispersion layer 123. The shock absorption layer 121, the strain relaxation layer 122, and the shock dispersion layer 123 are disposed in this order from the light output face 110A of the display panel 110. Among the shock absorption layer 121, the strain relaxation layer 122, and the shock dispersion layer 123, the shock absorption layer 121 may be disposed most adjacent to the light output face 110A. Among the shock absorption layer 121, the strain relaxation layer 122, and the shock dispersion layer 123, the shock dispersion layer 123 may be disposed farthest from the light output face 110A. The strain relaxation layer 122 may be disposed between the shock absorption layer 121 and the shock dispersion layer 123.

[Shock Dispersion Layer 123]

The shock dispersion layer 123 may disperse an external force exerted on the display 100 to prevent the external force from focusing on a certain point. The shock dispersion layer 123 may also prevent damage, such as scratches, on the surface of the display 100. The shock dispersion layer 123 may include, for example, a flexible reinforced-glass member. The shock dispersion layer 123 may have a Young's modulus of 50 GPa or greater, for example.

Alternatively, the shock dispersion layer 123 may be a resin film having flexibility. In general, a hard coat material is applied or deposited on a surface of a film base to improve the hardness of a resin film. The film base with the hard coat material on one side, however, is susceptible to warping, which could make a bonding process difficult to achieve. A resin film that includes the film base with the hard coat material on one side (hereinafter referred to as "single-sided HC treated film") is broken or warped by a residual stress in some cases where the resin film is bonded to the display panel. To address such a concern, the shock dispersion layer 123 may be formed by solidifying the hard coat material into a film (hereinafter referred to as "hard coat (HC) film") or applying or depositing the hard coat material on both sides of a film base (hereinafter referred to as "double-sided HC treated film" or "double-sided HC film"), for example. The HC film and the double-sided HC film may have flexibility, for example. The HC film and the double-sided HC treated film may be resistant to warping and may have a desired Young's modulus and a desired thickness. Accordingly, the HC film and the double-sided HC treated film may be suitable for the shock dispersion layer 123.

Figure 5:
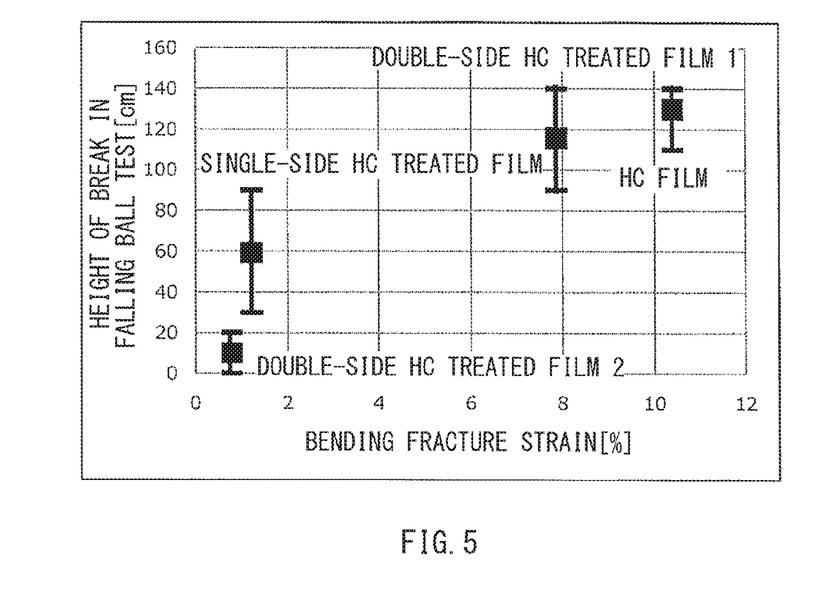
FIG. 5 is a graph illustrating experimental results of a falling ball test in which four films were measured for bending fracture strain and a height at which the film broke.

The shock dispersion layer 123 that includes a material resistant to bending stress may exhibit high impact resistance in a falling ball test. FIG. 5 illustrates experimental results of the falling ball test in which four HC films (i.e., a single-sided HC treated film, a double-sided HC treated film 1, a double-sided HC treated film 2, and a HC film) were measured for bending fracture strain and a height at which the film broke. It is apparent from FIG. 5 that the film having high bending fracture strain tends to break at a higher height in the falling ball test. To prevent the shock dispersion layer 123 from breaking, the shock dispersion layer 123 may include a HC film having a bending fracture strain of 4% or greater or a double-sided HC treated film having a bending fracture strain of 4% or greater, for example.

The shock dispersion layer 123 may have a thickness that allows the radius of curvature of the shock dispersion layer 123 to be 10 mm or less. For example, the shock dispersion layer 123 may have a thickness of 70 µm to 100 µm.

[Shock Absorption Layer 121]

Upon application of an external impact force on the shock dispersion layer 123, the shock absorption layer 121 may deform conforming to a curvature of the shock dispersion layer 123 formed by the external impact force to absorb the external impact force. In other words, the shock absorption layer 121 may have a shock absorption property. The shock absorption layer 121 may be a gel resin layer having a thickness of sub-millimeter order or greater. The shock absorption layer 121 that is a gel resin layer may have a rubber hardness of 17 to 24 degrees inclusive, for example. The shock absorption layer 121 having a rubber hardness of less than 17 degrees can be crushed by an impact force, which could result in insufficient absorption of the impact force. The rubber hardness may be measured through a standard test method for rubber property in accordance with America Society for Testing and Materials (ASTM) D2240-00 using a durometer, for example. The shock absorption layer 121 having a rubber hardness of greater than 24 can exhibit a slight deformation of the gel upon the application of an impact force, which could result in insufficient absorption of the impact force. The shock absorption layer 121 may be smaller in thickness in the example embodiment where the shock dispersion layer 123 is provided than in a case where the shock dispersion layer 123 is not provided and the shock absorption layer 121 is required to have a certain thickness, for example, about 2 mm.

Alternatively, the shock absorption layer 121 may be a gel adhesive layer. In such a case, the shock absorption layer 121 may have a bonding property to directly or indirectly bond the protection sheet 120 to the light output face 110A. In the example embodiment where the shock absorption layer 121 is the gel adhesive layer, the shock absorption layer 121 may include, for example, a gel acrylic adhesive. One possible example of the gel adhesive may be a silicone gel. The silicone gel, however, can cause oozing of the oil, which could reduce the reliability of the display.

[Strain Relaxation Layer 122]

The strain relaxation layer 122 may improve the crack resistance of the shock dispersion layer 123 against a load. If the shock dispersion layer 123 that includes a material having a high bending resistance is provided above the shock absorption layer 121 that is very soft, the shock dispersion layer 123 can be largely bent by a load and cracked beyond the bending fracture strain. To address such a concern, the strain relaxation layer 122 may be provided between the shock dispersion layer 123 and the shock absorption layer 121 to improve the cracking resistance of the shock dispersion layer 123 against a load in this example embodiment.

The strain relaxation layer 122 may be a resin layer having a bending strength and a tensile strength that are higher than the bending strength and the tensile strength of the shock dispersion layer 123. Specific but non-limiting examples of the resin layer may include a wet-laminated layer or a dry-laminated layer that is in close contact with a surface of the shock dispersion layer 123 adjacent to the display panel 110. The wet-laminated layer may be a resin layer that includes cured energy curable resin, such as a UV curable resin, and is provided on the surface of the shock dispersion layer 123 adjacent to the display panel 110. The dry-laminated layer may be a resin layer bonded to the surface of the shock dispersion layer 123 adjacent to the display panel 110.

The strain relaxation layer 122 may have a Young's modulus of 110 GPa inclusive, for example. The strain relaxation layer 122 may have a thickness of 10 µm to 100

µm, for example. The strain relaxation layer 122 having a thickness of less than 10 m can find it difficult to cover the fine asperity on the surface of the shock dispersion layer 123. The strain relaxation layer 122 having a thickness of greater than 100 µm can reduce the flexibility of the protection sheet 120.

Figure 6:
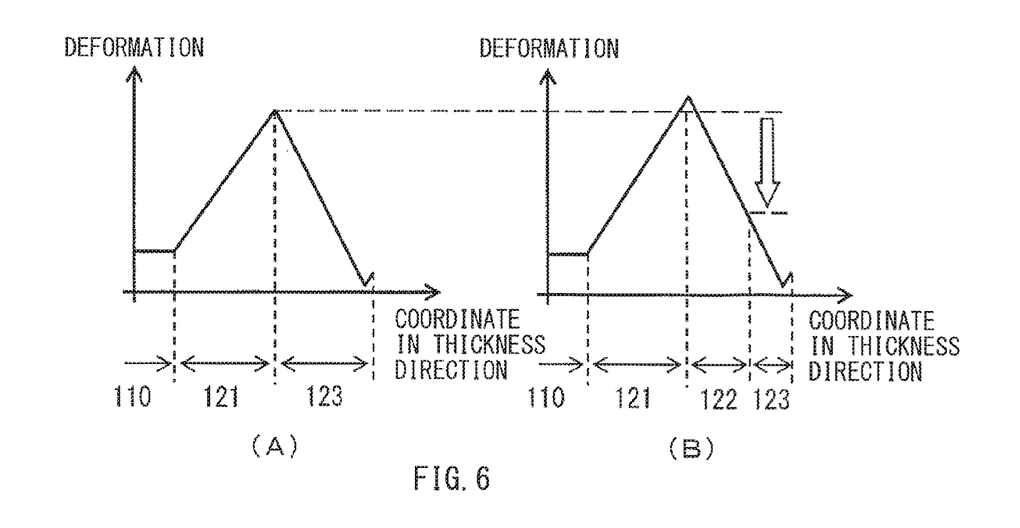
FIG. 6 is a diagram illustrating the distribution of deformation of a display, where (A) of FIG. 6 illustrates the distribution of deformation of a display according to a comparative example, and (B) of FIG. 6 illustrates the distribution of deformation of the display illustrated in FIG. 1.

FIG. 6 illustrates results of the stress simulation carried on a display without the strain relaxation layer 122 and the display 100 with the strain relaxation layer 122. (A) of FIG. 6 illustrates the distribution of deformation of the display without the strain relaxation layer 122 caused by the load on the surface of the protection sheet 120. (B) of FIG. 6 illustrates the distribution of deformation of the display 100 with the strain relaxation layer 122 caused by the load on the surface of the protection sheet 120. It is apparent from FIG. 6 that the strain relaxation layer 122 relaxes the deformation of the shock dispersion layer 123, improving the crack resistance of the shock dispersion layer 123.

Described below are example combinations between the shock dispersion layer 123 and the strain relaxation layer 122. Note that all of the shock dispersion layers 123 described below may have flexibility.

| Shock Dispersion Layer 123 | Strain Relaxation Layer 122 |
|---|---|
| 1. reinforced glass member | wet-laminated layer |
| 2. reinforced glass member | dry-laminated layer |
| 3. organic/inorganic hybrid HC film | wet-laminated layer |
| 4. organic/inorganic hybrid HC film | dry-laminated layer |
| 5. HC treated PET-based film | wet-laminated layer |
| 6. HC treated PET-based film | dry-laminated layer |
| 7. HC treated TAC-based film | wet-laminated layer |
| 8. HC treated TAC-based film | dry-laminated layer |
| 9. HC treated PC-based film | wet-laminated layer |
| 10. HC treated PC-based film | dry-laminated layer |
| 11. HC treated PMMA-based film | wet-laminated layer |
| 12. HC treated PMMA-based film | dry-laminated layer |

The HC film may be a film including a hard coat material solidified. The organic/inorganic hybrid HC film may include a hard coat material in which an organic material and an inorganic material are mixed. The HC treated film may be a film base subjected to a hard coating treatment. The PET-based material may be a film base including polyethylene terephthalate (PET). The TAC-based film may be a film base including tantalum carbide (TaC). The PC-based film may be a film base including polycarbonate (PC). The PMMA-based film may be a film base including polymethyl methacrylate (PMMA).

In this example embodiment, the protection sheet 120 may include the shock absorption layer 121, the strain relaxation layer 122, and the shock dispersion layer 123 that are laminated in this order from the display panel 110. However, the laminated structure of the the protection sheet 120 is not limited thereto.

Figure 7:
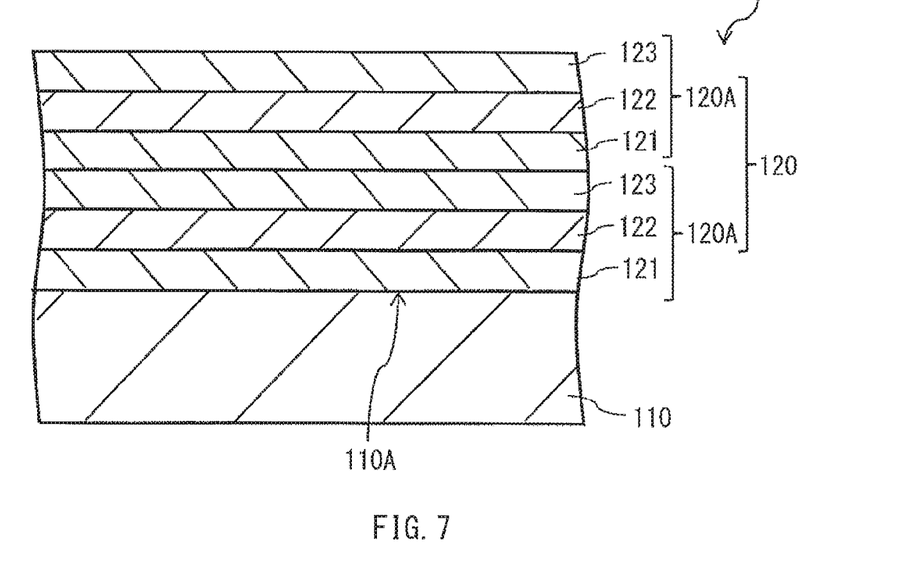
FIG. 7 is a cross-sectional view of the display panel illustrated in FIG. 1 having an example configuration according to one modification example.
Figure 8:
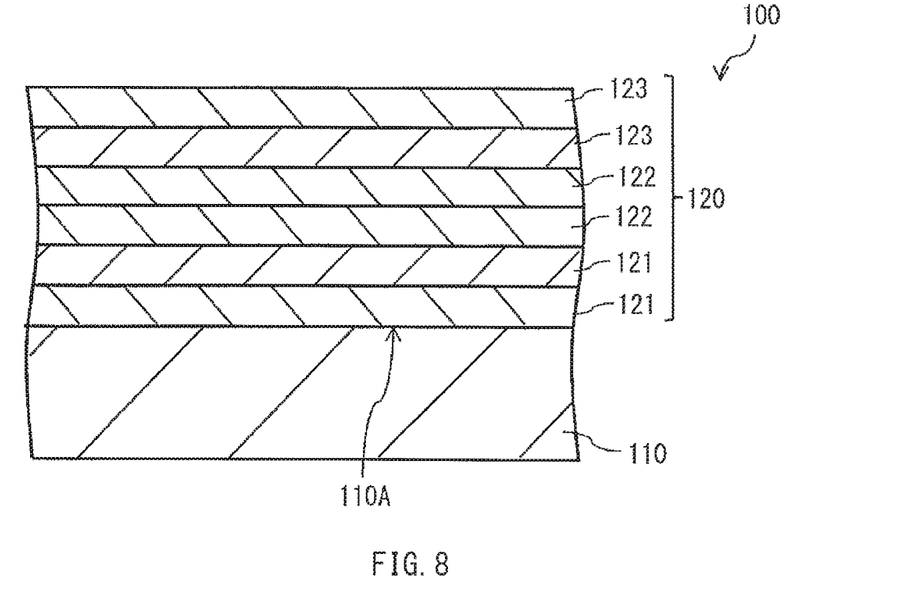
FIG. 8 is a cross-sectional view of the display illustrated in FIG. 1 having an example configuration according to one modification example.

Alternatively, as illustrated in FIG. 7, for example, the protection sheet 120 may include multiple laminates 120A each including the shock absorption layer 121, the strain relaxation layer 122, and the shock dispersion layer 123 that are laminated in this order from the display panel 110. Still alternatively, as illustrated in FIG. 8, for example, the protection sheet 120 may include multiple shock absorption layers 121, multiple strain relaxation layers 122, and multiple shock dispersion layers 123 that are laminated in this order from the display panel 110. In such a case, the number of the shock absorption layers 121, the number of the strain relaxation layers 122, and the number of the shock dispersion layers 123 may be equal to each other or different from each other. Increasing the number of laminated layers makes it possible to improve the shock resistance.

[Effects]

Some effects of the display 100 will now be described.

An external impact force exerted on a display can damage a surface or an internal portion of the display, which could result in malfunctions of the display. Flexible displays, in particular, are disadvantageous in their low shock resistance in spite of their advantages of thinness, light-weight, and flexibility. To improve the shock resistance, a typical display includes a reinforced glass sheet attached to a surface of the display. Unfortunately, a flexible display with a reinforced glass sheet inevitably increases in weight and thickness. A possible measure against this concern is to etch the reinforced glass sheet into a thin thickness. However, the reinforced glass sheet etched into a thin thickness suffers from a significant decrease in shock resistance and is readily broken just by a small external force.

In contrast, the shock absorption layer 121 is provided below the shock dispersion layer 123 in any of the example embodiments of the disclosure. The shock absorption layer 121 is a gel resin layer having a thickness of sub-millimeter order or greater. Upon application of an external impact force on the shock dispersion layer 123, the shock absorption layer 121 may deform conforming to a curvature of the shock dispersion layer 123 formed by the external impact force to absorb the external impact force. It is difficult to impart such a property to a thin adhesive layer intended simply to bond layers.

Further, the strain relaxation layer 122 is provided between the shock dispersion layer 123 and the shock absorption layer 121 in any of the example embodiments of the disclosure. The strain relaxation layer 122 is a wet-laminated layer or a dry-laminated layer that is in close contact with a surface of the shock dispersion layer 123 adjacent to the display panel. This causes the strain relaxation layer 122 to exert a compressive stress on the shock dispersion layer 123. Accordingly, it is possible to reduce the occurrence of break of the shock dispersion layer 123 beyond the bending fracture strain.

Further, the shock dispersion layer 123 includes a flexible reinforced-glass member, a flexible HC film, or a flexible double-sided HC film in any of the example embodiments of the disclosure. This makes it possible to reduce the occurrence of damage on a surface or an internal portion of the display that could result in malfunctions of the display. Accordingly, it is possible in any of the example embodiments of the disclosure to provide a protection sheet having high shock resistance and flexibility, a display including such a protection sheet, and an electronic apparatus including such a display.

Further, the strain relaxation layer 122 provided between the shock dispersion layer 123 and the shock absorption layer 121 may have a bending strength and a tensile strength that are higher than the bending strength and the tensile strength of the shock dispersion layer 123 in some of the example embodiments of the disclosure. This configuration makes it possible to reduce the occurrence of break of the shock dispersion layer 123 beyond the bending fracture strain even in the condition where the shock dispersion layer 123 is disposed above the shock absorption layer 121 that is very soft. Accordingly, it is possible in the example embodiments of the disclosure to reduce the occurrence of the break of the display while achieving absorption of external impact force.

The shock dispersion layer 123 may have a thickness that allows the radius of curvature of the shock dispersion layer 123 to be 10 mm or less, in some of the example embodiments of the present disclosure. For example, the shock dispersion layer 123 may have a thickness of 100 µm or less. Even in a condition where the shock dispersion layer 123 is very thin, the compressive force exerted from the strain relaxation layer 122 to the shock dispersion layer 123 makes it possible to reduce the occurrence of break of the shock dispersion layer 123 beyond the bending fracture strain.

In some of the example embodiments of the present disclosure where the shock absorption layer 121 is a gel adhesive layer, the protection sheet 120 may be bonded directly or indirectly to the light output face 110A of the display panel 110. The protection sheet 120 may thus be bonded in a process separate from the process of producing the display panel 110. Accordingly, bonding the protection sheet 120 to the finished panel 110 makes it possible to reduce the occurrence of cracks in the display panel 110 while achieving the absorption of the external impact force. Additionally, oozing of oil does not occur in some of the example embodiments of the disclosure where the shock absorption layer 121 includes a gel acrylic adhesive, unlike in the case of the shock absorption layer 121 including silicone gel. Accordingly, the display according to the example embodiments of the disclosure is prevented from decreasing in the reliability.

In some of the example embodiments of the disclosure where the device formation substrate 111 and the sealing substrate 114 are each be a flexible plastic substrate and where the display panel 110 is thus a flexible organic EL panel, the entire laminate including the display panel 110 and the protection sheet 120 may serve as a flexible display. Such a flexible display may have high portability and versatility. For example, the flexible display may be rolled when carried, or may be attached on a wall.

2. Modification Examples

Some modification examples of the display 100 will now be described. In the following description, components that are common to those of the display 100 according to the foregoing example embodiments are assigned with the same reference numerals without redundant descriptions thereof.

Modification Example A

Figure 9:
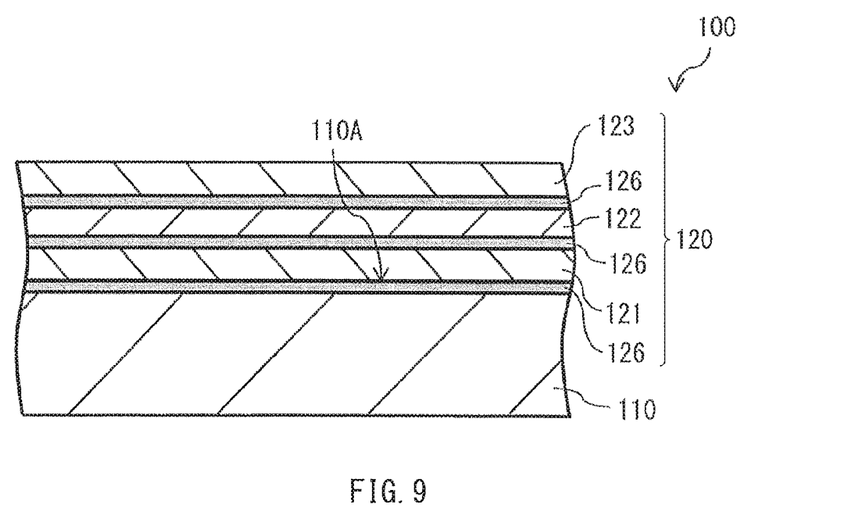
FIG. 9 is a cross-sectional view of the display illustrated in FIG. 1 having an example configuration according to one modification example.

In Modification Example A of the foregoing example embodiments of the disclosure, the shock absorption layer 121, the strain relaxation layer 122, and the shock dispersion layer 123 may each be a resin sheet. In Modification Example A, the display 100 may include an adhesive layer 126 between the shock absorption layer 121 and the display panel 110, between the strain relaxation layer 122 and the shock absorption layer 121, and between the shock dispersion layer 123 and the strain relaxation layer 122, as illustrated in FIG. 9, for example.

Modification Example B

Figure 10:
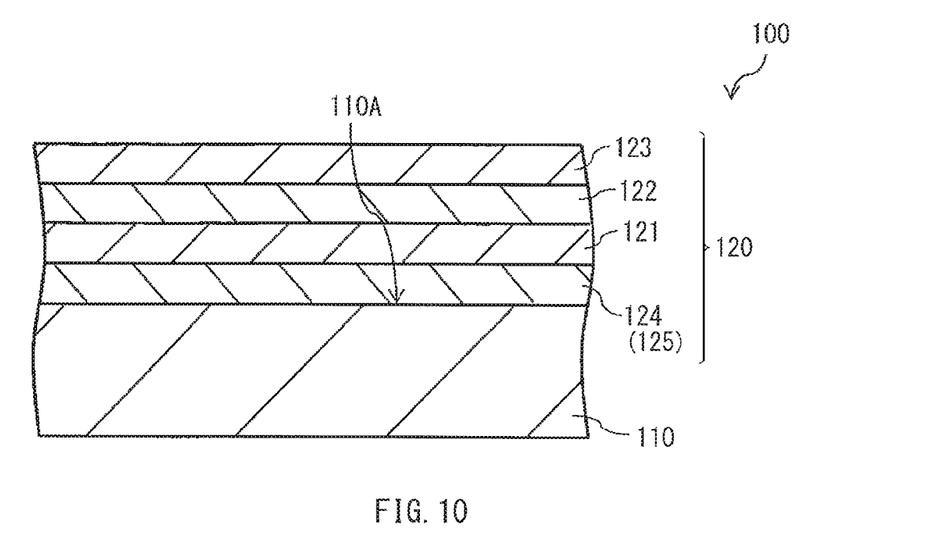
FIG. 10 is a cross-sectional view of the display illustrated in FIG. 1 having an example configuration according to one modification example.

In Modification Example B of the foregoing example embodiments of the disclosure, the protection sheet 120 may include an optical film 124 or a touch panel 125 between the light output face 110A and the shock absorption layer 121, as illustrated in FIG. 10, for example. Specific but non-limiting examples of the optical film 124 may include a polarization plate, such as a circularly polarization plate, an anti-glare (AG) film, and a low reflection (LR) film. The touch panel 125 may include a transparent wire. For example, the transparent wire in the touch panel 125 may include a light-transmissive electrically-conductive material, such as indium tin oxide (ITO). The touch panel 125 including the transparent wire may be disposed, for example, below the shock absorption layer 121 in view of its high fragility.

Modification Example C

Figure 11:
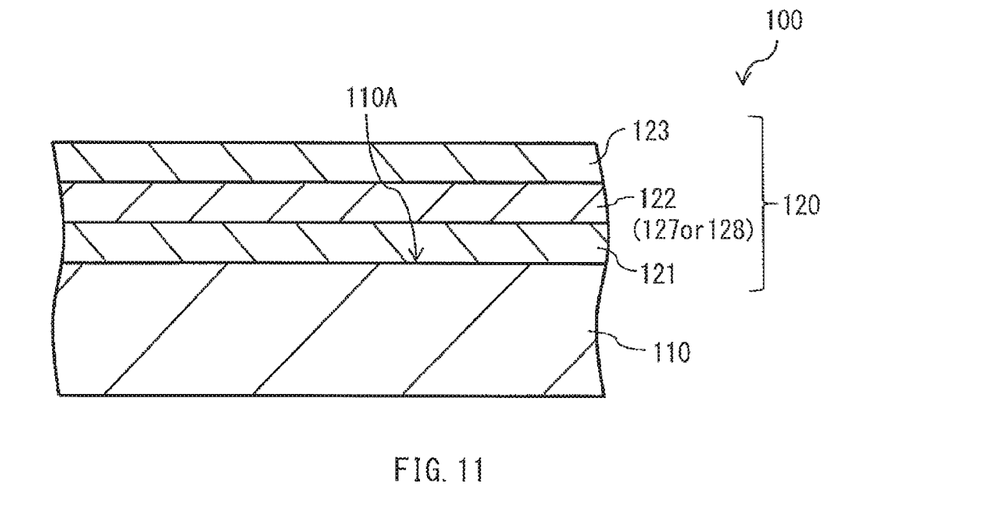
FIG. 11 is a cross-sectional view of the display illustrated in FIG. 1 having an example configuration according to one modification example.

In Modification Example C of the foregoing example embodiments of the disclosure, the strain relaxation layer 122 may include an optical film 127, such as a polarization plate, or a touch panel 128 that includes a metal wire of copper (Cu), as illustrated in FIG. 11, for example. The touch panel 128 including the metal wire may have flexibility and shock resistance higher than those of the touch panel 125 including the transparent wire. Accordingly, the optical film 127 that is a polarization plate or the touch panel 128 that includes the metal wire may be provided as the strain relaxation layer 122 to reduce the thickness of the protection sheet 120 and manufacturing costs.

Modification Example D

Figure 12:
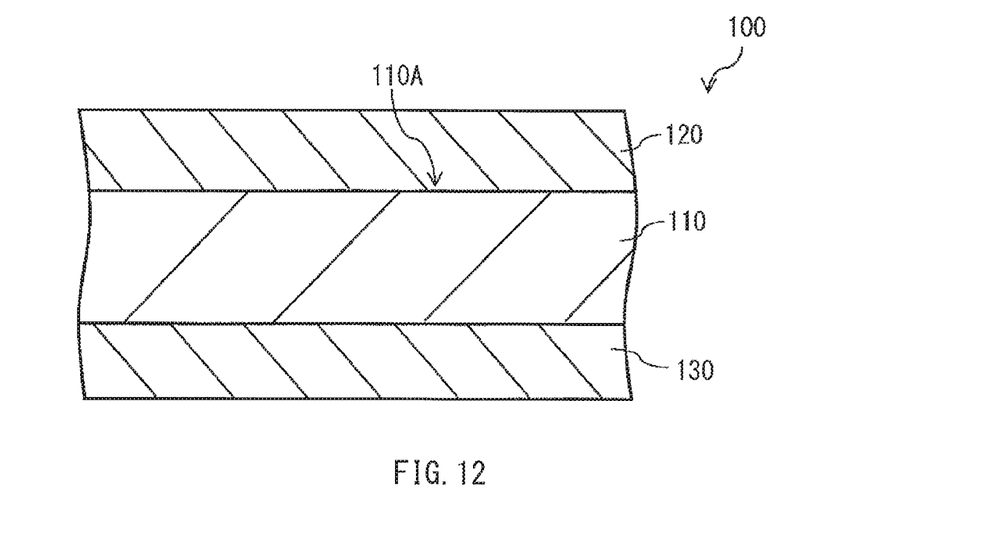
FIG. 12 is a cross-sectional view of the display illustrated in FIG. 1 having an example configuration according to one modification example.

In some of the foregoing example embodiments of the disclosure, the device formation substrate 111 and the sealing substrate 114 may each be a flexible plastic substrate and the display panel 110 may thus be a flexible organic EL panel. In Modification Example D of the example embodiments, the display 100 may further include a protection sheet 130 provided on a rear face of the display panel 110, as illustrated in FIG. 12, for example. The protection sheet 130 may improve the rigidity of the display panel 110 and reduce local deflection of the display panel 110 upon application of an impact force on the display panel 110. The protection sheet 130 may include a material having a high Young's modulus and resistant to plastic deformation, for example. In one example, the protection sheet 130 may include a metal material that includes, for example, 42 nickel (Ni), stainless steel (SUS), magnesium (Mg) alloy, or aluminum (Al). The protection sheet 130 including such a metal material may also dissipate heat generated in the display panel 110. Alternatively, the protection sheet 130 may be a sheet of resin, such as PET, PI, PC, or PMMA, having a rigidity of substantially the same level as that of the protection sheet 120. The protection sheet 130 including a resin sheet may also provide effects that are similar to those of the protection sheet 120.

Modification Example E

Figure 13:
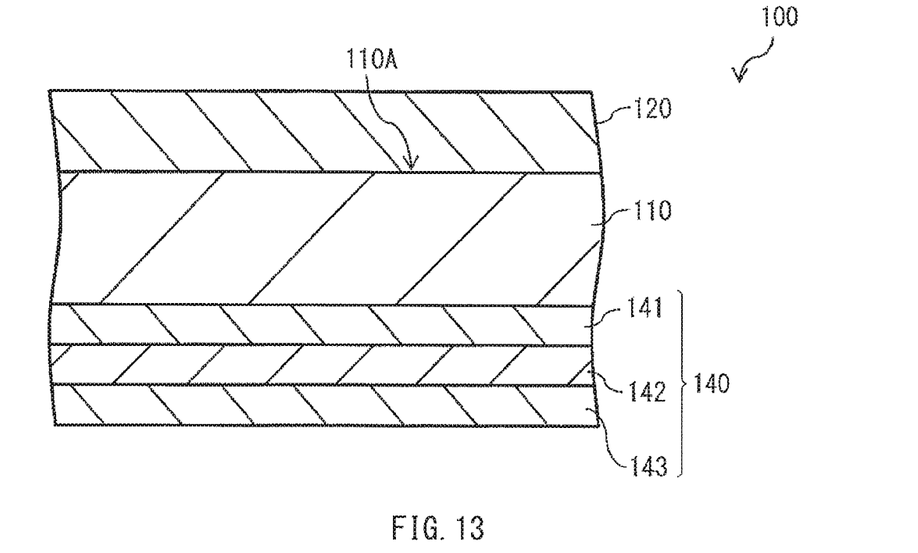
FIG. 13 is a cross-sectional view of the display illustrated in FIG. 1 having an example configuration according to one modification example.

In some of the foregoing example embodiments of the disclosure, the device formation substrate 111 and the sealing substrate 114 may each be a flexible plastic substrate and the display panel 110 may thus be a flexible organic EL panel. In Modification Example E of the example embodiments, the display 100 may further include a protection sheet 140 provided on a rear face of the display panel, as illustrated in FIG. 13, for example. With reference to FIG. 13, for example, the protection sheet 140 may include a shock absorption layer 141, a strain relaxation layer 142, and a shock dispersion layer 143. The shock absorption layer 141, the strain relaxation layer 142, and the shock dispersion layer 143 may be disposed in this order from the rear face of the display panel 110. Among the shock absorption layer 141, the strain relaxation layer 142, and the shock dispersion layer 143, the shock absorption layer 141 may be disposed most adjacent to the rear face of the display panel 110. Among the shock absorption layer 141, the strain relaxation layer 142, and the shock dispersion layer 143, the shock dispersion layer 143 may be disposed farthest from the rear face of the display panel 110. The strain relaxation layer 142 may be disposed between the shock absorption layer 141 and the shock dispersion layer 143. The shock absorption layer 141 may have a configuration the same as that of the shock absorption layer 121. The strain relaxation layer 142 may have a configuration the same as that of the strain relaxation layer 122. The shock dispersion layer 143 may have a configuration the same as that of the shock dispersion layer 123.

In Modification Example E, the protection sheet 140 provided on the rear face of the display panel 110 may have a configuration common to that of the protection sheet 120. This allows the stress that is exerted by the protection sheet 120 on the display panel 110 and the stress that is exerted by the protection sheet 140 on the display panel 110 to offset each other, preventing warping and deflection of the display panel due to the protection sheet 120.

Modification Example F

Figure 14:
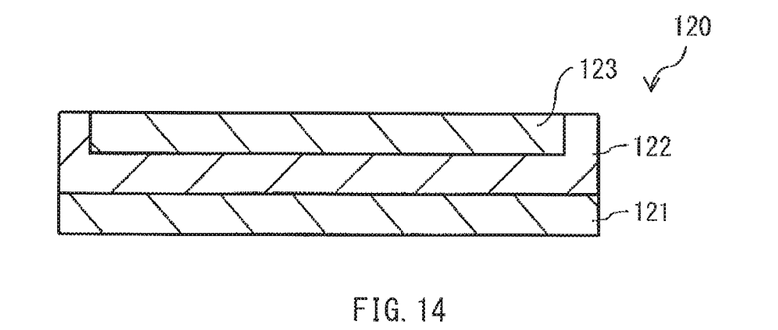
FIG. 14 is a cross-sectional view of a protection sheet illustrated in FIG. 1 having an example configuration according to one modification example.
Figure 15:
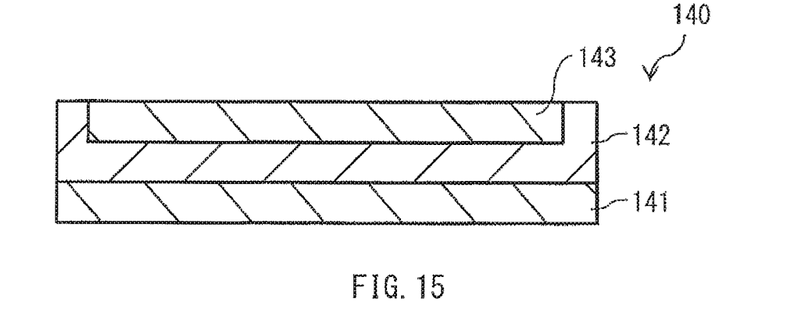
FIG. 15 is a cross-sectional view of the protection sheet illustrated in FIG. 13 having an example configuration according to one modification example.

In Modification Example F of some of the foregoing example embodiments of the disclosure, the strain relaxation layer 122 may cover a side face of the shock dispersion layer 123 as well as a rear face (adjacent to the strain relaxation layer 122) of the shock dispersion layer 123, as illustrated in FIG. 14. Likewise, the strain relaxation layer 142 may cover a side face of the shock dispersion layer 143 as well as a rear face (adjacent to the strain relaxation layer 142) of the shock dispersion layer 143, as illustrated in FIG. 15. In Modification Example F, the strain relaxation layer 122 may be in contact with the side face of the shock dispersion layer 123 as well as the rear face (adjacent to the strain relaxation layer 122) of the shock dispersion layer 123. Likewise, the strain relaxation layer 142 may be in contact with the side face of the shock dispersion layer 143 as well as the rear face (adjacent to the strain relaxation layer 142) of the shock dispersion layer 143. In a case where the shock dispersion layers 123 and 143 each include the flexible reinforced-glass member, the strain relaxation layers 122 and 142 make it possible to disperse respective local stresses exerted on the asperities on the side faces of the the shock dispersion layers 123 and 143. This makes it possible to further improve the shock resistance of the shock dispersion layers 123 and 143.

In Modification Example F, the strain relaxation layers 122 and 142 may cover peripheral portions of the top faces (remote from the display panel 110) of the shock dispersion layers 123 and 143 as well as the rear faces (adjacent to the strain relaxation layers 122 and 142) and the side faces of the shock dispersion layers 123 and 143. This makes it possible to further improve the shock resistance of the shock dispersion layers 123 and 143.

3. Application Examples

Described below are application examples of the display 100 according to the foregoing example embodiments or modification examples of the disclosure. The display 100 is applicable to a variety of displays of electronic apparatuses that display images or pictures based on external or internal image signals. Specific but non-limiting examples of the electronic apparatuses may include television apparatuses, digital cameras, notebook personal computers, sheet-like personal computers, portable terminal devices, such as mobile phones, and video cameras.

Figure 16:
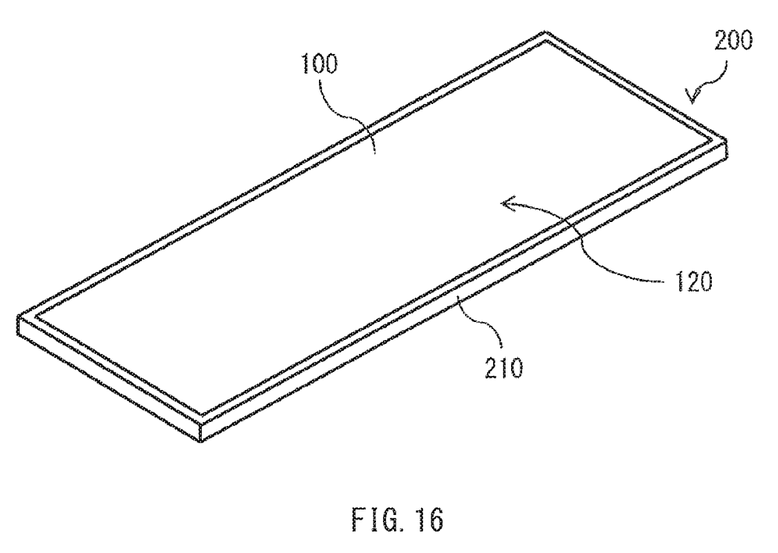
FIG. 16 is a perspective view of the external appearance of a display according to one example embodiment or one modification example of the example embodiment.

FIG. 16 is a perspective view of the external appearance of an electronic apparatus 200 according to an application example. The electronic apparatus 200 may be, for example, a sheet-like personal computer that includes a body 210 having a display surface on its main face. The display 100 according to any of the foregoing example embodiments or modification examples of the disclosure may be provided on the display surface of the electronic apparatus 200. The display 100 may be disposed with the protection sheet 120 facing outward. The electronic apparatus 200 of the application example that is provided with the display 100 including the protection sheet 120 is light-weight and resistant to cracking.

The electronic apparatus 200 provided with the display 100 of the application example may optionally include the protection sheet 140. The electronic apparatus 200 is unlikely cause warping and deflection.

Although the disclosure is described hereinabove with reference to the example embodiments, modification examples, and application examples, these example embodiments, modification examples, and application examples are not to be construed as limiting the scope of the disclosure and may be modified in a wide variety of ways. It should be appreciated that the effects described herein are mere examples. Effects of the example embodiments, modification examples, and application examples of the disclosure are not limited to those described herein. The disclosure may further include any effects other than those described herein.

It is possible to achieve at least the following configurations from the foregoing example embodiments of the technology.

Example embodiments include a display having: a display panel having flexibility and a light output face; and a first protection sheet provided on the light output face, the first protection sheet including a first shock dispersion layer including a flexible reinforced-glass member, a flexible hard-coat film, or a flexible double-sided hard-coat film, a first strain relaxation layer including a wet-laminated layer or a dry-laminated layer that is in close contact with a surface of the first shock dispersion layer adjacent to the display panel, and a first shock absorption layer including a gel layer having a thickness of submillimeter order or greater, the first shock absorption layer, the first strain relaxation layer, and the first shock dispersion layer being laminated in this order from the light output face of the display panel.

In example embodiments of the above display, the first strain relaxation layer includes a resin and has a bending strength and a tensile strength higher than a bending strength and a tensile strength of the first shock dispersion layer.

In example embodiments of the above display, the wet-laminated layer includes a resin layer including a cured energy curable resin and provided on the surface of the first shock dispersion layer adjacent to the display panel.

In example embodiments of the above display, the dry-laminated layer includes a resin layer laminated on the surface of the first shock dispersion layer adjacent to the display panel.

In example embodiments of the above display, the first shock dispersion layer has a thickness that allows a radius of curvature of the first shock dispersion layer to be 10 mm or less.

In example embodiments of the above display, in which the first shock dispersion layer includes a hard-coat film having a bending fracture strain of 4% or greater or a double-sided hard-coat film having a bending fracture strain of 4% or greater.

In example embodiments of the above display, the first strain relaxation layer has a Young's modulus of 1 to 10 GPa inclusive.

In example embodiments of the above display, the display panel includes an organic electroluminescent panel.

In example embodiments of the above display, the first shock absorption layer includes a gel acrylic adhesive.

In example embodiments of the above display, the first shock absorption layer comprises includes a gel resin layer having a rubber hardness of 17 to 24 degrees inclusive.

In example embodiments, the above display further includes a second protection sheet that is provided on a rear face of the display panel.

In example embodiments, the second protection sheet includes a second shock dispersion layer including a flexible reinforced-glass member, a flexible hard-coat film, or a flexible double-sided hard-coat film; a second strain relaxation layer including a wet-laminated layer or a dry-laminated layer that is in close contact with a surface of the second shock dispersion layer adjacent to the display panel; and a second shock absorption layer including a gel layer, the second shock absorption layer, the second strain relaxation layer, and the second shock dispersion layer being laminated in this order from the rear face of the display panel.

In example embodiments of the above display, the strain relaxation layer is in contact with a face of the shock dispersion layer adjacent to the strain relaxation layer and a side face of the shock dispersion layer.

In example embodiments, an electronic apparatus has a display including a display panel having a light output face; and a protection sheet provided on the light output face, the protection sheet including a shock dispersion layer including a flexible reinforced-glass member, a flexible hard-coat film, or a flexible double-sided hard-coat film, a strain relaxation layer including a wet-laminated layer or a dry-laminated layer that is in close contact with a surface of the shock dispersion layer adjacent to the display panel, and a shock absorption layer including a gel layer having a thickness of submillimeter order or greater, the shock absorption layer, the strain relaxation layer, and the shock dispersion layer being laminated in this order from the light output face of the display panel.

In example embodiments, a protection sheet configured to protect a light output face of a display panel includes a shock dispersion layer including a flexible reinforced-glass member, a flexible hard-coat film, or a flexible double-sided hard-coat film; a strain relaxation layer including a wet-laminated layer or a dry-laminated layer that is in close contact with a surface of the shock dispersion layer adjacent to the display panel; and a shock absorption layer including a gel layer having a thickness of submillimeter order or greater, the shock absorption layer, the strain relaxation layer, and the shock dispersion layer being laminated in this order from the light output face.

The protection sheet, the display, and the electronic apparatus according to any of the example embodiments, modification examples, and application examples of the disclosure each include the shock absorption layer provided below the shock dispersion layer. The shock absorption layer is a gel resin layer having a thickness of submillimeter order or greater. Upon application of an external impact force on the shock dispersion layer, the shock absorption layer deforms conforming to a curvature of the shock dispersion layer formed by the external impact force to absorb the external impact force. It is difficult to impart such a property to a thin adhesive layer intended simply to bond layers. Further, according to any of the example embodiments, modification examples, and application examples of the disclosure, the strain relaxation layer is disposed between the shock dispersion layer and the shock absorption layer. The strain relaxation layer is a wet-laminated layer or a dry-laminated layer that is in close contact with the surface of the shock dispersion layer adjacent to the display panel. This configuration causes the strain relaxation layer to exert a compressive stress on the shock dispersion layer, reducing the occurrence of break of the shock dispersion layer beyond the bending fracture strain. Furthermore, according to the example embodiments, modification examples, and application examples of the disclosure, the shock dispersion layer includes a flexible reinforced-glass member, a flexible hard-coat film, or a flexible double-sided hard-coat film. This makes it possible to reduce the occurrence of damage on a surface or an internal portion of the display that could result in malfunctions of the display.

According to any of the example embodiments, modification examples, and application examples of the disclosure, it is possible to provide a protection sheet having high shock-resistance and flexibility, the display including such a protection sheet, and an electronic apparatus including such a display. It is to be noted that the effects described hereinabove are mere examples. The effects of the example embodiments, modification examples, and application examples of the disclosure are not limited to those described hereinabove. The disclosure may further include other effects in addition to the effects described hereinabove.

Although the disclosure is described hereinabove in terms of the example embodiments, modification examples, and application examples, it is not limited thereto. It should be appreciated that variations may be made in the described example embodiments, modification examples, and application examples by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:
1. A display, comprising:
a display panel having flexibility and a light output face; and
a first protection sheet provided on the light output face, the first protection sheet including
a first shock dispersion layer comprising a flexible reinforced-glass member and having a Young's modulus of at least 50 GPa, a first strain relaxation layer comprising a wet-laminated layer or a dry-laminated layer that is in close contact with a surface of the first shock dispersion layer adjacent to the display panel, the first strain relaxation layer including a resin, having a bending strength greater than a bending strength of the first shock dispersion layer, having a tensile strength greater than a tensile strength of the first shock dispersion layer, and having a Young's modulus of 1 to 10 GPa inclusive, and a first shock absorption layer comprising a gel layer having a thickness of submillimeter order or greater, the first shock absorption layer, the first strain relaxation layer, and the first shock dispersion layer being laminated in this order from the light output face of the display panel.

2. The display according to claim 1, wherein the first strain relaxation layer comprises the wet-laminated layer, and the wet-laminated layer comprises a resin layer including a cured energy curable resin and provided on the surface of the first shock dispersion layer adjacent to the display panel.

3. The display according to claim 1, wherein the first strain relaxation layer comprises the dry-laminated layer, and the dry-laminated layer comprises a resin layer laminated on the surface of the first shock dispersion layer adjacent to the display panel.

4. The display according to claim 1, wherein the first shock dispersion layer has a thickness that allows a radius of curvature of the first shock dispersion layer to be 10 mm or less.

5. The display according to claim 1, wherein the first shock dispersion layer includes a hard-coat film having a bending fracture strain of 4% or greater or a double-sided hard-coat film having a bending fracture strain of 4% or greater.

6. The display according to claim 1, wherein the display panel comprises an organic electroluminescent panel.

7. The display according to claim 1, wherein the first shock absorption layer includes a gel acrylic adhesive.

8. The display according to claim 1, wherein the first shock absorption layer comprises a gel resin layer having a rubber hardness of 17 to 24 degrees inclusive.

9. The display according to claim 1, further comprising a second protection sheet that is provided on a rear face of the display panel, the second protection sheet includes:

a second shock dispersion layer comprising a flexible reinforced-glass member, a flexible hard-coat film, or a flexible double-sided hard-coat film;

a second strain relaxation layer comprising a wet-laminated layer or a dry-laminated layer that is in close contact with a surface of the second shock dispersion layer adjacent to the display panel; and a second shock absorption layer comprising a gel layer, the second shock absorption layer, the second strain relaxation layer, and the second shock dispersion layer being laminated in this order from the rear face of the display panel.

10. The display according to claim 1, wherein the strain relaxation layer is in contact with a face of the shock dispersion layer adjacent to the strain relaxation layer and a side face of the shock dispersion layer.

11. An electronic apparatus with a display, the display comprising:

a display panel having a light output face; and a protection sheet provided on the light output face, the protection sheet including a shock dispersion layer comprising a flexible reinforced-glass member and having a Young's modulus of at least 50 GPa, a strain relaxation layer comprising a wet-laminated layer or a dry-laminated layer that is in close contact with a surface of the shock dispersion layer adjacent to the display panel, the strain relaxation layer including a resin, having a bending strength greater than a bending strength of the shock dispersion layer, having a tensile strength greater than a tensile strength of the shock dispersion layer, and having a Young's modulus of 1 to 10 GPa inclusive, and a shock absorption layer comprising a gel layer having a thickness of submillimeter order or greater, the shock absorption layer, the strain relaxation layer, and the shock dispersion layer being laminated in this order from the light output face of the display panel.

12. A protection sheet configured to protect a light output face of a display panel, the protection sheet comprising:

a shock dispersion layer comprising a flexible reinforced-glass member and having a Young's modulus of at least 50 GPa;

a strain relaxation layer comprising a wet-laminated layer or a dry-laminated layer that is in close contact with a surface of the shock dispersion layer adjacent to the display panel, the strain relaxation layer including a resin, having a bending strength greater than a bending strength of the shock dispersion layer, having a tensile strength greater than a tensile strength of the shock dispersion layer, and having a Young's modulus of 1 to 10 GPa inclusive; and a shock absorption layer comprising a gel layer having a thickness of submillimeter order or greater, the shock absorption layer, the strain relaxation layer, and the shock dispersion layer being laminated in this order from the light output face.

* * * * *